US009351285B2

(12) United States Patent
Goto et al.

(10) Patent No.: US 9,351,285 B2
(45) Date of Patent: May 24, 2016

(54) WIRELESS CONTROL DEVICE, WIRELESS TERMINAL DEVICE, WIRELESS COMMUNICATION SYSTEM, CONTROL PROGRAM AND INTEGRATED CIRCUIT THAT PERFORMS SIGNAL DETECTION USING TURBO EQUALIZATION

(75) Inventors: Jungo Goto, Osaka (JP); Hiroki Takahashi, Osaka (JP); Osamu Nakamura, Osaka (JP); Kazunari Yokomakura, Osaka (JP); Yasuhiro Hamaguchi, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 323 days.

(21) Appl. No.: 13/981,242

(22) PCT Filed: Dec. 8, 2011

(86) PCT No.: PCT/JP2011/078433
§ 371 (c)(1),
(2), (4) Date: Aug. 20, 2013

(87) PCT Pub. No.: WO2012/101912
PCT Pub. Date: Aug. 2, 2012

(65) Prior Publication Data
US 2013/0329682 A1    Dec. 12, 2013

(30) Foreign Application Priority Data
Jan. 24, 2011    (JP) ................................ 2011-011979

(51) Int. Cl.
*H04W 72/04*    (2009.01)
*H04L 25/03*    (2006.01)
(Continued)

(52) U.S. Cl.
CPC .......... *H04W 72/04* (2013.01); *H03M 13/2957* (2013.01); *H03M 13/6331* (2013.01);
(Continued)

(58) Field of Classification Search
CPC ..... H04L 1/005; H04L 1/0618; H04L 1/0003; H04L 1/0009; H04L 1/0015; H04L 1/0066; H04L 25/03171; H04L 1/0025; H04L 1/0057; H04W 72/04; H04J 11/003; H03M 13/2957; H03M 13/6331; H03M 13/1102; H03M 12/23
See application file for complete search history.

(56) References Cited

U.S. PATENT DOCUMENTS

2004/0132416 A1 * 7/2004 Yee ........................ H04L 1/0618
                                                                    455/82
2007/0153943 A1 * 7/2007 Nissila .................. H04L 25/067
                                                                    375/341
(Continued)

FOREIGN PATENT DOCUMENTS

WO    WO 2009/022709 A1    2/2009

OTHER PUBLICATIONS

MCC Support, "Draft Report of 3GPP TSG RAN WG1 #62 v0.1.0", 3GPP TSG RAN WG1 Meeting #62bis R1-10xxxx, X'ian, China, Oct. 11-15, 2010.

*Primary Examiner* — Hoang-Chuong Vu
(74) *Attorney, Agent, or Firm* — Birch, Stewart, Kolasch & Birch, LLP

(57) ABSTRACT

A convergence property as ability of removing inter-user interference of turbo equalization is improved in case of using a transmission method in which overlapping of a part of spectrum is allowed among a plurality of users. A wireless control device receiving a signal which is transmitted at the same transmitting timing by a plurality of wireless terminal devices, and performs a signal detection using turbo equalization, and the device includes a transmission method determination unit 211 which selects a communication parameter of which a convergence property of turbo equalization is higher than that of a communication parameter which is used in a transmission method in which a spectrum is not overlapped with respect to at least one wireless terminal device, in case of performing data transmission using a transmission method in which at least a part of the spectrum is overlapped between the wireless terminal devices, and a control information transmission unit 217 which informs the wireless terminal device of the selected communication parameter.

10 Claims, 15 Drawing Sheets

(51) Int. Cl.
  *H03M 13/29*  (2006.01)
  *H03M 13/00*  (2006.01)
  *H04J 11/00*  (2006.01)
  *H04L 1/00*  (2006.01)
  *H03M 13/11*  (2006.01)
  *H03M 13/23*  (2006.01)

(52) U.S. Cl.
  CPC ............. *H04J11/003* (2013.01); *H04L 1/0003* (2013.01); *H04L 1/005* (2013.01); *H04L 1/0009* (2013.01); *H04L 1/0015* (2013.01); *H04L 1/0025* (2013.01); *H04L 1/0066* (2013.01); *H04L 25/03171* (2013.01); *H03M 13/1102* (2013.01); *H03M 13/23* (2013.01); *H04L 1/0057* (2013.01)

(56) References Cited

U.S. PATENT DOCUMENTS

| | | | |
|---|---|---|---|
| 2009/0304065 A1* | 12/2009 | Choi et al. | 375/232 |
| 2010/0104041 A1* | 4/2010 | Ibi et al. | 375/285 |
| 2011/0044377 A1* | 2/2011 | Ibi et al. | 375/133 |
| 2011/0212743 A1 | 9/2011 | Yokomakura et al. | |
| 2015/0009843 A1* | 1/2015 | Takahashi et al. | 370/252 |

* cited by examiner

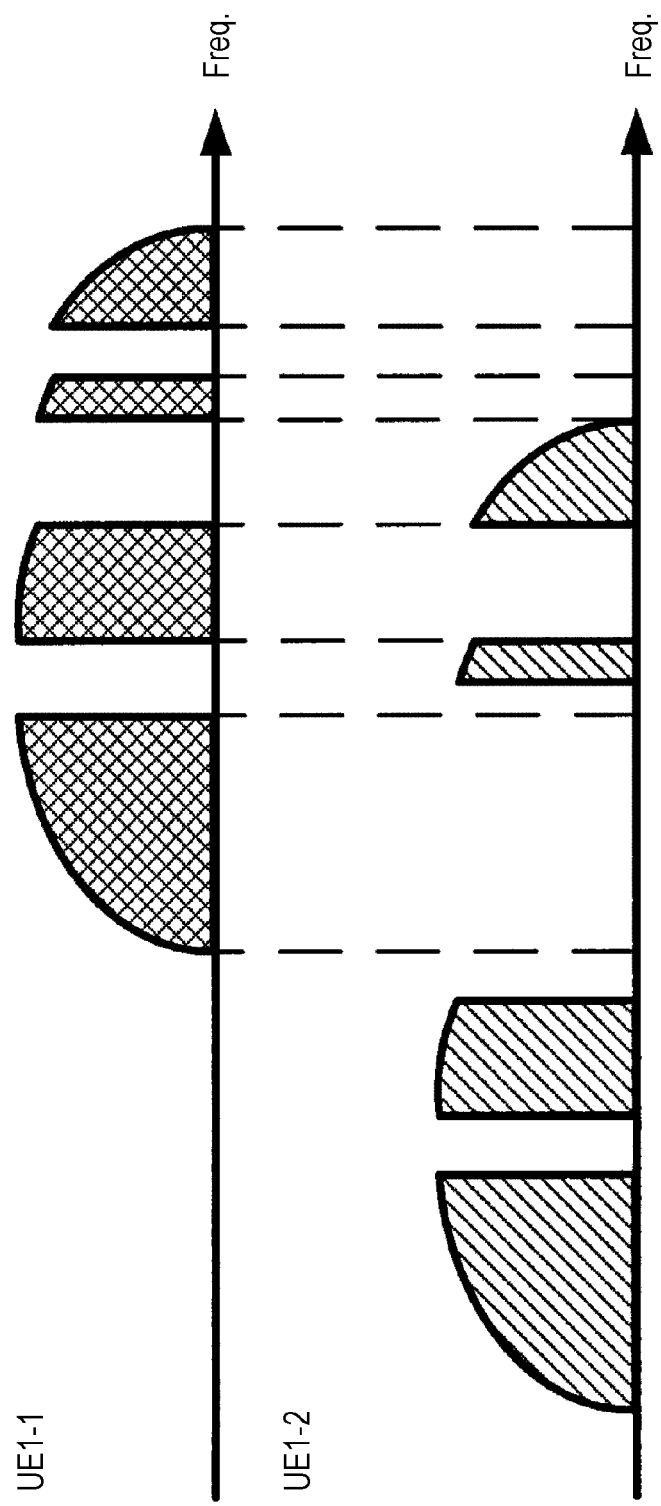

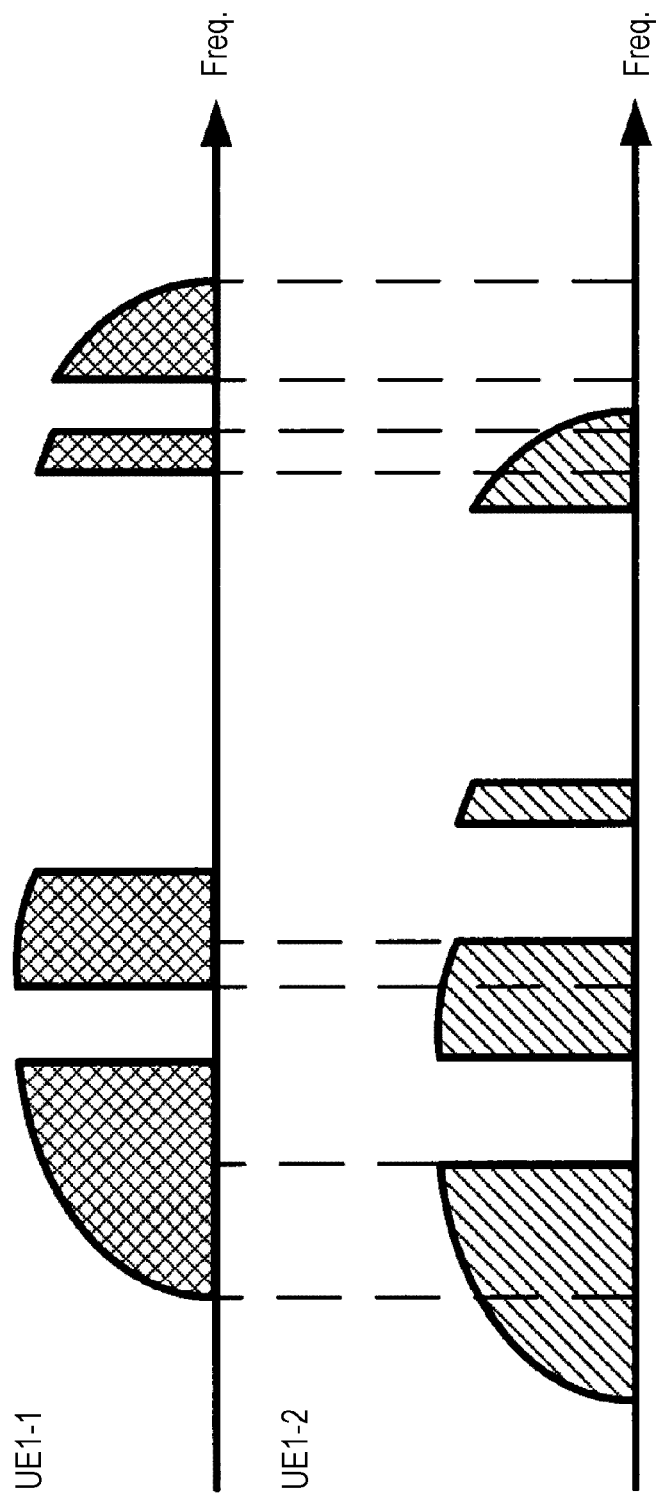

WIRELESS CONTROL DEVICE, WIRELESS TERMINAL DEVICE, WIRELESS COMMUNICATION SYSTEM, CONTROL PROGRAM AND INTEGRATED CIRCUIT THAT PERFORMS SIGNAL DETECTION USING TURBO EQUALIZATION

TECHNICAL FIELD

The present invention relates to a technology in which a plurality of transmission devices transmit a part of frequencies by overlappingly allocating the frequencies.

BACKGROUND ART

In a mobile body wireless communication system, an improvement of use efficiency of a frequency as limited resources has been a problem since expanding of bandwidth in a system band has been progressed due to a rapid increase in traffic. As a technology for improving frequency use efficiency, there is Clustered Discrete Fourier Transform Spread Orthogonal Frequency Division Multiplexing (DFT-S-OFDM) (refer to NPL 1). The Clustered DFT-S-OFDM is also referred to as a Dynamic Spectrum Control (DSC), and DFT-S-OFDM with a Spectrum Division Control (SDC).

In the Clustered DFT-S-OFDM where a single carrier spectrum is divided into clusters as a partial spectrum, it is possible to allocate the clusters to a frequency having high channel gain in a band. In case of such discrete band allocating, when a plurality of users perform a frequency division multiple access (FDMA), respectively, since a user is allocated to a certain band which is limited to one user, it is not necessarily the case that all of users are able to use a frequency with high gain. For this reason, in order to gain maximum channel gain even in a case in which a data transmission is performed in the plurality of users, a data transmission in which a part of spectrum is allowed to be overlapped among the plurality of users has been studied (refer to PTL 1). Even in such data transmission in which inter-user interference occurs, it is possible to detect a signal of each user using a reception device by applying a turbo equalization technology as an iterative equalization technology. Here, the turbo equalization is a technology in which a signal is detected by iteration process based on a turbo principle among a Maximum A Posteriori (MAP) detector and a decoder to exchange extrinsic information.

CITATION LIST

Patent Literature

PTL 1: Pamphlet of International Publication No. 2009/022709

Non Patent Literature

NPL 1: 3GPP Draft Report of 3GPP TSG RAN WG1 #62 v0.1.0

SUMMARY OF INVENTION

Technical Problem

However, in the transmission method in which overlapping of a part of spectrum is allowed among a plurality of users, there has been a problem in that a transmission performance deteriorates in a case in which inter-user interference cannot be completely cancelled by turbo equalization.

The present invention has been made in consideration of such a problem, and an object thereof is to provide a wireless control device, a wireless terminal device, a wireless communication system, a control program, and an integrated circuit which are able to improve a convergence property as ability of removing inter-user interference of turbo equalization in case of using a transmission method of allowing overlapping of a part of spectrum among a plurality of users.

Solution to Problem (1) In order to achieve the above object, the present invention takes the following means. That is, a wireless control device according to the present invention is a wireless control device receiving a signal which is transmitted by a plurality of wireless terminal devices at the same transmission timing, and performs a signal detection using turbo equalization, and includes a transmission method determination unit which selects a communication parameter of which a convergence property of turbo equalization is higher than that of a communication parameter which is used in a transmission method in which a spectrum is not overlapped with respect to at least one wireless terminal device, in case of performing data transmission using a transmission method in which at least a part of the spectrum is overlapped between the wireless terminal devices, and a control information transmission unit which notifies the wireless terminal device of the selected communication parameter.

In this manner, in case of performing data transmission using a transmission method in which at least a part of the spectrum is overlapped between the wireless terminal devices, the wireless control device selects the communication parameter of which the convergence property of the turbo equalization is higher than that of the communication parameter which is used in the transmission method in which the spectrum is not overlapped with respect to at least one wireless terminal device, it is possible to prevent a serious deterioration in the transmission property due to remaining inter-user interference after the turbo equalization, and to realize an improvement of cell throughput or frequency use efficiency.

(2) In addition, in the wireless control device according to the present invention, the transmission method determination unit selects a communication parameter of which a convergence property of turbo equalization is higher than that of the communication parameter which is used in the transmission method in which a spectrum is not overlapped between the wireless terminal devices, based on a ratio of a spectrum which is overlapped between the wireless terminal devices to a spectrum which is not overlapped therebetween.

In this manner, since the wireless control device selects the communication parameter of which the convergence property of the turbo equalization is higher than that of the communication parameter which is used in the transmission method in which a spectrum is not overlapped between the wireless terminal devices, based on a ratio of a spectrum which is overlapped between the wireless terminal devices to a spectrum which is not overlapped therebetween, it is possible to prevent a serious deterioration in the transmission property due to remaining inter-user interference after the turbo equalization, and to realize an improvement of cell throughput or frequency use efficiency.

(3) In addition, in the wireless control device according to the present invention, the transmission method determination unit uses a turbo code as a communication parameter in the transmission method in which a spectrum is not overlapped between the wireless terminal devices, and on the other hand, the transmission method determination unit uses a convolutional code, or a Low Density Parity Check (LDPC) code as a communication parameter with respect to at least one wireless terminal device in the transmission method in which at least a part of spectrum is overlapped between the wireless terminal devices.

In this manner, since the wireless control device uses the turbo code as the communication parameter in the transmission method in which a spectrum is not overlapped between the wireless terminal devices, and on the other hand, the wireless control device uses the convolutional code, or the Low Density Parity Check (LDPC) code as the communication parameter with respect to at least one wireless terminal device in the transmission method in which at least a part of spectrum is overlapped between the wireless terminal devices, it is possible to prevent the serious deterioration in the transmission property due to the remaining inter-user interference after the turbo equalization, and to realize the improvement of cell throughput or the frequency use efficiency.

(4) In addition, in the wireless control device according to the present invention, the transmission method determination unit uses either a high coding rate or high order modulation as the communication parameter in the transmission method in which a spectrum is not overlapped between the wireless terminal devices, and on the other hand, the transmission method determination unit uses a coding rate which is lower than the coding rate, or modulation order which is lower than the modulation order as the communication parameter in the transmission method in which at least a part of spectrum is overlapped between the wireless terminal devices.

In this manner, since the wireless control device uses any one of the high coding rate, or the high order modulation as the communication parameter in the transmission method in which a spectrum is not overlapped between the wireless terminal devices, and on the other hand, uses the low coding rate which is lower than the coding rate, or the low order modulation which is lower than the modulation order as the communication parameter in the transmission method in which at least a part of the spectrum is overlapped between the wireless terminal devices, it is possible to prevent the serious deterioration in the transmission property due to the remaining inter-user interference after the turbo equalization, and to realize the improvement of cell throughput or the frequency use efficiency.

(5) In addition, in the wireless control device according to the present invention, the transmission method determination unit uses the high order modulation as the communication parameter in the transmission method in which a spectrum is not overlapped between the wireless terminal devices, and on the other hand, uses modulation order which is lower than the modulation order, and the convolutional code, or the Low Density Parity Check (LDPC) code as the communication parameter in the transmission method in which at least a part of the spectrum is overlapped between the wireless terminal devices.

In this manner, since the wireless control device uses the high order modulation as the communication parameter in the transmission method in which a spectrum is not overlapped between the wireless terminal devices, and on the other hand, uses modulation order which is lower than the modulation order, and the convolutional code, or the Low Density Parity Check (LDPC) code as the communication parameter in the transmission method in which at least a part of the spectrum is overlapped between the wireless terminal devices, it is possible to prevent the serious deterioration in the transmission property due to the remaining inter-user interference after the turbo equalization, and to realize the improvement of cell throughput or the frequency use efficiency.

(6) In addition, in the wireless control device according to the present invention, the transmission method determination unit increases the coding rate so as to maintain the number of bits which can be transmitted in case of using the low order modulation.

In this manner, since the wireless control device increases the coding rate so as to maintain the number of bits which can be transmitted in case of using the low order modulation, it is possible to prevent the serious deterioration in the transmission property due to the remaining inter-user interference after the turbo equalization, and to realize the improvement of cell throughput or the frequency use efficiency while maintaining the number of bits.

(7) In addition, in the wireless control device according to the present invention, the transmission method determination unit selects either the transmission method in which at least a part of spectrum is overlapped between the wireless terminal devices, or the transmission method in which the spectrum is not overlapped between the wireless terminal devices according to a channel property in each of the wireless terminal devices.

In this manner, since the wireless control device selects either the transmission method in which at least a part of spectrum is overlapped between the wireless terminal devices, or the transmission method in which the spectrum is not overlapped between the wireless terminal devices according to a channel property in each of the wireless terminal devices, it is possible to obtain maximum channel gain even when a plurality of users perform data transmission.

(8) In addition, the wireless terminal device according to the present invention performs data transmission with respect to the wireless control device using a communication parameter which is informed from the wireless control device which is disclosed in any one of (1) to (7).

In this manner, since the wireless terminal device performs the data transmission with respect to the wireless control device using the communication parameter which is informed from the wireless control device which is disclosed in any one of (1) to (7), the wireless control device is able to prevent the serious deterioration in the transmission property due to the remaining inter-user interference after the turbo equalization, and to realize the improvement of cell throughput or the frequency use efficiency.

(9) In addition, a wireless communication system according to the present invention is configured by the wireless control device which is disclosed in any one of (1) to (7), and the wireless terminal device which is disclosed in (8).

In this manner, since the wireless communication system is configured by the wireless control device disclosed in any one of (1) to (7), and the wireless terminal device disclosed in (8), it is possible to prevent the serious deterioration in the transmission property due to the remaining inter-user interference after the turbo equalization, and to realize the improvement of cell throughput or the frequency use efficiency.

(10) In addition, a control program according to the present invention is a control program of a wireless control device which performs a signal detection using turbo equalization by receiving a signal which is transmitted at the same transmission timing by a plurality of wireless terminal devices, in which a series of processes of a process of selecting either a transmission method in which at least a part of spectrum is overlapped between the wireless terminal device, or a transmission method in which the spectrum is not overlapped between the wireless terminal devices according to a channel property in each of the wireless terminal devices; a process of selecting a communication parameter of which a convergence property of turbo equalization is higher than that in a communication parameter which is used in the transmission method in which the spectrum is not overlapped, with respect to at least one wireless terminal device, in case of performing data transmission using the transmission method in which at least a part of spectrum is overlapped between the wireless terminal devices; and a process of notifying the wireless terminal device of the selected communication parameter are made a command so as to be readable and executable in a computer.

In this manner, in a case in which the control program performs a data transmission using the transmission method in which at least a part of spectrum is overlapped between the wireless terminal devices, since a communication parameter of which a convergence property of turbo equalization is higher than that in a communication parameter which is used in the transmission method in which the spectrum is not overlapped is selected with respect to at least one wireless terminal device, the wireless control device is able to prevent the serious deterioration in the transmission property due to the remaining inter-user interference after the turbo equalization, and to realize the improvement of cell throughput or the frequency use efficiency.

(11) In addition, an integrated circuit according to the present invention is an integrated circuit which causes the wireless control device to perform a plurality of functions, in which the wireless control device is caused to perform a series of functions of performing a signal detection using turbo equalization by receiving a signal which is transmitted at the same transmission timing by a plurality of wireless terminal devices, of selecting either a transmission method in which at least a part of spectrum is overlapped between the wireless terminal devices or a transmission method in which the spectrum is not overlapped between the wireless terminal devices according to a channel property in each of the wireless terminal devices, of selecting a communication parameter of which a convergence property of turbo equalization is higher than that in a communication parameter which is used in the transmission method in which the spectrum is not overlapped, with respect to at least one wireless terminal device, in case of performing a data transmission using the transmission method in which at least a part of spectrum is overlapped between the wireless terminal devices, and of informing the wireless terminal device of the selected communication parameter.

In this manner, in a case in which the integrated circuit performs the data transmission using the transmission method in which at least a part of spectrum is overlapped between the wireless terminal devices, since a communication parameter of which the convergence property of the turbo equalization is higher than that in the communication parameter which is used in the transmission method in which the spectrum is not overlapped is selected in at least one wireless terminal device, the wireless control device is able to prevent the serious deterioration in the transmission property due to the remaining inter-user interference after the turbo equalization, and to realize the improvement of cell throughput or the frequency use efficiency.

Advantageous Effects of Invention

By applying the present invention, it is possible to improve a convergence property of turbo equalization, and to realize an improvement in frequency use efficiency in case of using a transmission method in which at least a part of spectrum is allowed to be overlapped among a plurality of users.

BRIEF DESCRIPTION OF DRAWINGS

FIG. 3A is a diagram which illustrates an example of band allocations in UE1-1 and UE1-2 which are determined in a reception device 3 according to the present invention (in case of performing data transmission using frequency division multiplexing).

FIG. 3B is a diagram which illustrates an example of band allocations in the UE1-1 and UE1-2 which are determined in the reception device 3 according to the present invention (in case of allowing overlapping of a part of spectrum).

DESCRIPTION OF EMBODIMENTS

Hereinafter, embodiments of the invention will be described with reference to drawings. In the following embodiment, an uplink transmission in which a transmission device performing a data transmission is set to a mobile station device, and a reception device which receives data is set to a base station device will be described, however, it is also possible to be applied to a downlink transmission (transmission from base station device to mobile station device).

[First Embodiment]

Figure 1:
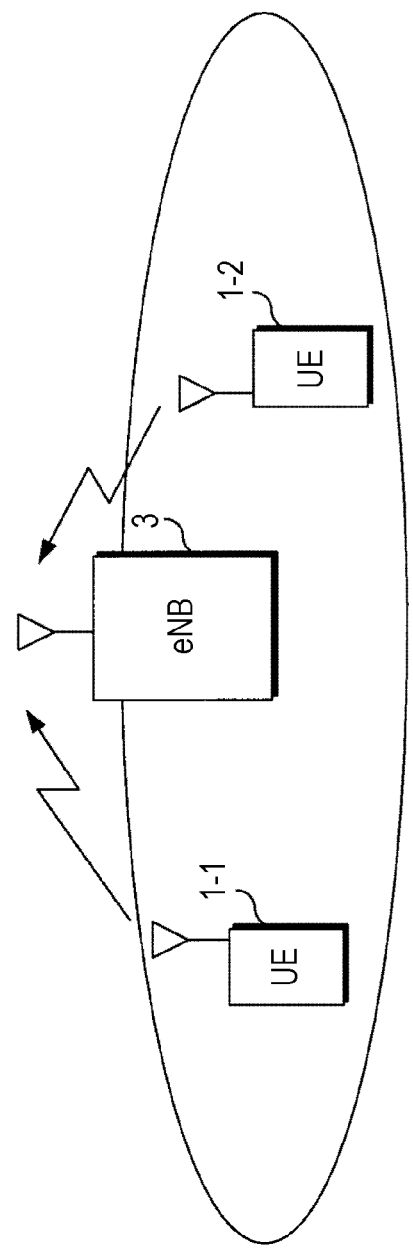
FIG. 1 is a conceptual diagram which illustrates a configuration of a wireless communication system of the present invention.

FIG. 1 is a conceptual diagram which illustrates a wireless communication system in the present invention. The communication system according to the embodiment is configured by a UE (hereinafter, referred to as transmission device) 1-1 and UE1-2 as wireless communication systems which transmit data signals, and an eNB (hereinafter, referred to as reception device) 3 as a wireless communication device which receives a data signal. A UE1, or a transmission device 1 is denoted by combining the UE1-1 and UE1-2. The UE1-1 and UE1-2 are able to perform transmitting at the same time, and performs a simultaneous access using frequency division multiplexing. In addition, in case of performing a simultaneous data transmission by the UE1-1 and UE1-2, it is also possible to perform a transmission in which a part of spectrum is overlapped. In the reception device 3, signals which are transmitted at the same time are performed with signal reception processing in each transmission device 1. In the figure, the number of transmission devices 1 is set to two, however, it may be more than two, and the number of antennas for transceiving may be one, or two or more.

Figure 2A:
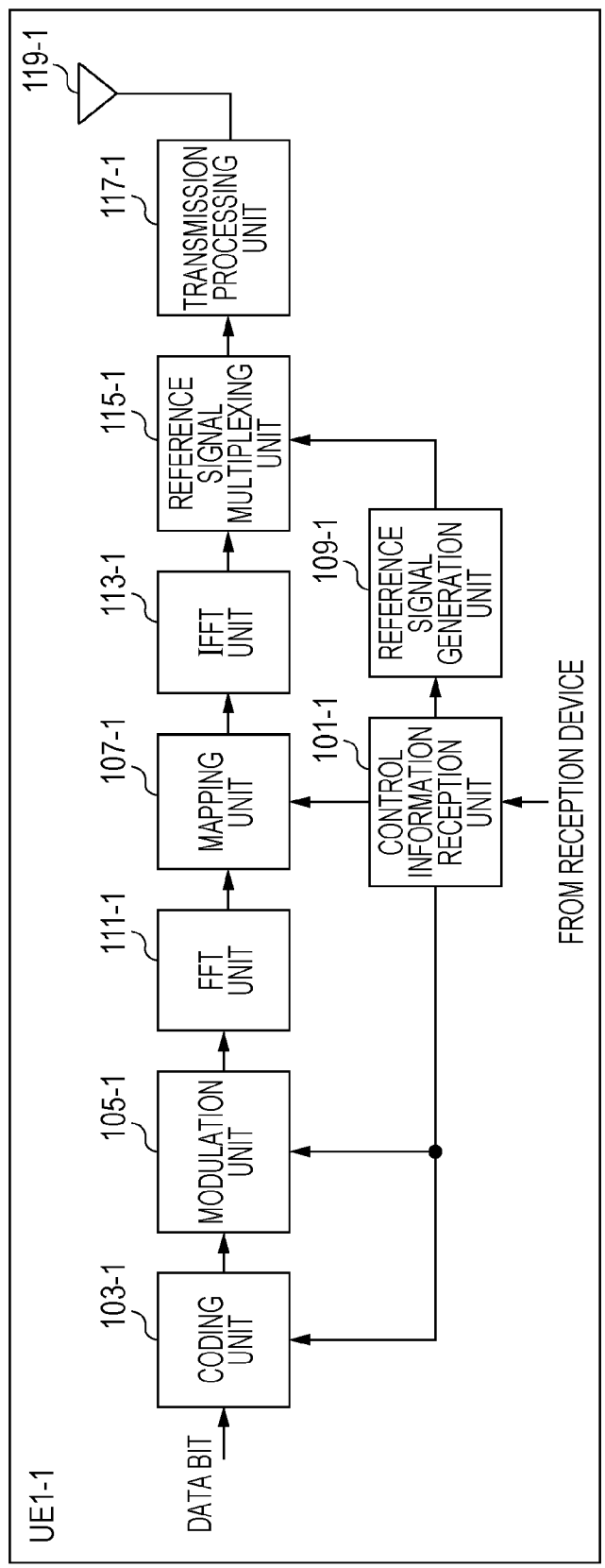
FIG. 2A is a block diagram which illustrates an example of a UE1-1 as a transmission device 1 of the present invention.
Figure 2B:
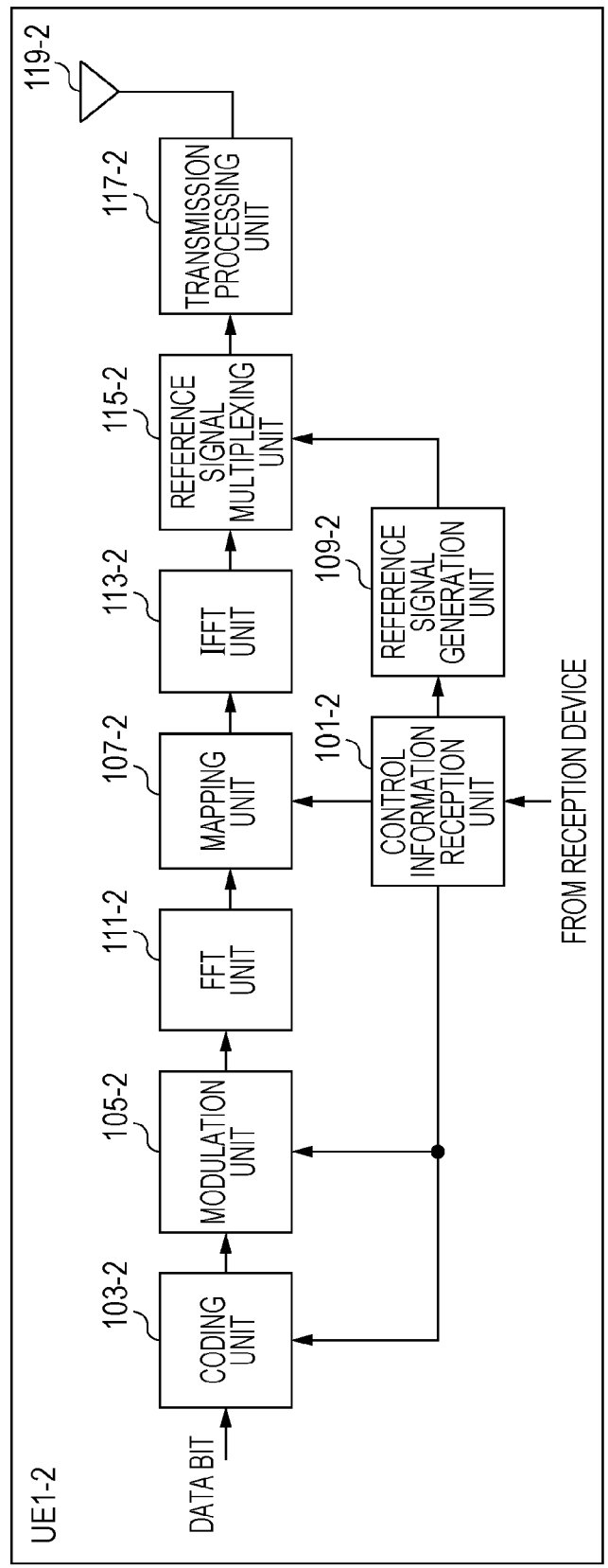
FIG. 2B is a block diagram which illustrates an example of a UE1-2 as the transmission device 1 of the present invention.

FIGS. 2A and 2B are block diagrams which illustrate examples of the UE1-1 and UE1-2 as the transmission device 1 according to the present invention. However, they are minimum block diagrams which are necessary for describing the present invention. In the transmission device 1 in FIGS. 2A and 2B, since the UE1-1 and UE1-2 generate data signals independently, and have the same configuration, descriptions will be made using the block diagram of the UE1-1. In the UE1-1, control information which is informed from the reception device 3 is received in a control information reception unit 101-1. Band allocation information which is used in a data transmission, information relating to a modulation scheme and coding rate (hereinafter, referred to as Modulation and Coding Scheme (MCS) by combining coding rate and modulation scheme), or the like is included in the control information. In addition, usually the MCS denotes a combination of the modulation scheme and the coding rate, however, since the coding rate is uniquely determined by the number of information bits such as a transport block size, a modulation scheme, and a bandwidth, a notification of such an MCS may be used.

The control information reception unit 101-1 inputs information on a coding method or a coding rate which is included in received control information to a coding unit 103-1, inputs information on modulation order to a modulation unit 105-1, and inputs band allocation information to a mapping unit 107-1, and a reference signal generation unit 109-1. Here, a parameter which is used in generation processing of these transmission signals is determined in each transmission device 1 in the reception device 3, however, details thereof will be described later. The coding unit 103-1 performs error correcting coding with respect to the input data bits based on information on the coding method or coding rate which is notified by the control information. As an example of the error correcting coding, there is a convolutional code, a turbo code, a Low Density Parity Check (LDPC) code, or the like. The modulation unit 105-1 performs a modulation of the modulation order which is input from the control information reception unit 101-1 among modulations such as Quaternary Phase Shift Keying (QPSK), 16-ary Quadrature Amplitude Modulation (16QAM), and the like, with respect to code bits. A modulation symbol which is output from the modulation unit 105-1 is converted into a data signal in a frequency region from a time region in an FFT unit 111-1, and is output to the mapping unit 107-1 thereafter.

The mapping unit 107-1 performs a signal allocation with respect to the input data signal in the frequency region based on the band allocation information which is notified by the control information reception unit 101-1. The signal which is output from the mapping unit 107-1 is converted into a signal in a time region in an IFFT unit 113-1. On the other hand, in the reference signal generation unit 109-1, band allocation information of data is input from the control information reception unit 101-1, a signal with the same length as the bandwidth which is used in a data transmission is generated, and is allocated to the same frequency as the data. Thereafter, in the reference signal generation unit 109-1, the allocated reference signal is converted into a signal in a time region from a frequency region, and is input to a reference signal multiplexing unit 115-1. In the reference signal multiplexing unit 115-1, the data signal and a reference signal for a demodulation which is input from the reference signal generation unit 109-1 is multiplexed. In the example, a configuration in which the reference signal is multiplexed in the time region is adopted, however, it may be a configuration in which the reference signal is multiplexed in the frequency region.

The signal in which the reference signal is multiplexed is inserted with a Cyclic Prefix (CP) in a transmission processing unit 117-1, is converted into an analog signal using a Digital/Analog (DA) conversion, and is performed with upconversion into a wireless frequency thereafter. The signal which is performed with the upconversion is amplified to a transmission power using a Power Amplifier (PA), and is transmitted from a transmission antenna 119-1 thereafter. The UE1-1 and UE1-2 also generate transmission signals through the same processing, and perform the data transmission.

FIGS. 3A and 3B are diagrams which illustrate examples of band allocation of the UE1-1 and UE1-2 which are determined in the reception device 3 according to the present invention. A case of performing a data transmission by the plurality of transmission devices 1 using the frequency division multiplexing is illustrated in FIG. 3A, and a case of allowing overlapping of a part of spectrum is illustrated in FIG. 3B. In the frequency division multiplexing in FIG. 3A, an allocation in the reception device 3 is determined with respect to the transmission device 1 which performs a data transmission at the same time so as to be orthogonal onto a frequency axis. On the other hand, in case of allowing overlapping of a part of spectrum in FIG. 3B, the orthogonality on the frequency axis is broken, an occurrence of inter-user interference is allowed, and the reception device 3 allocates a frequency with high channel gain to each transmission device 1.

Figure 4:
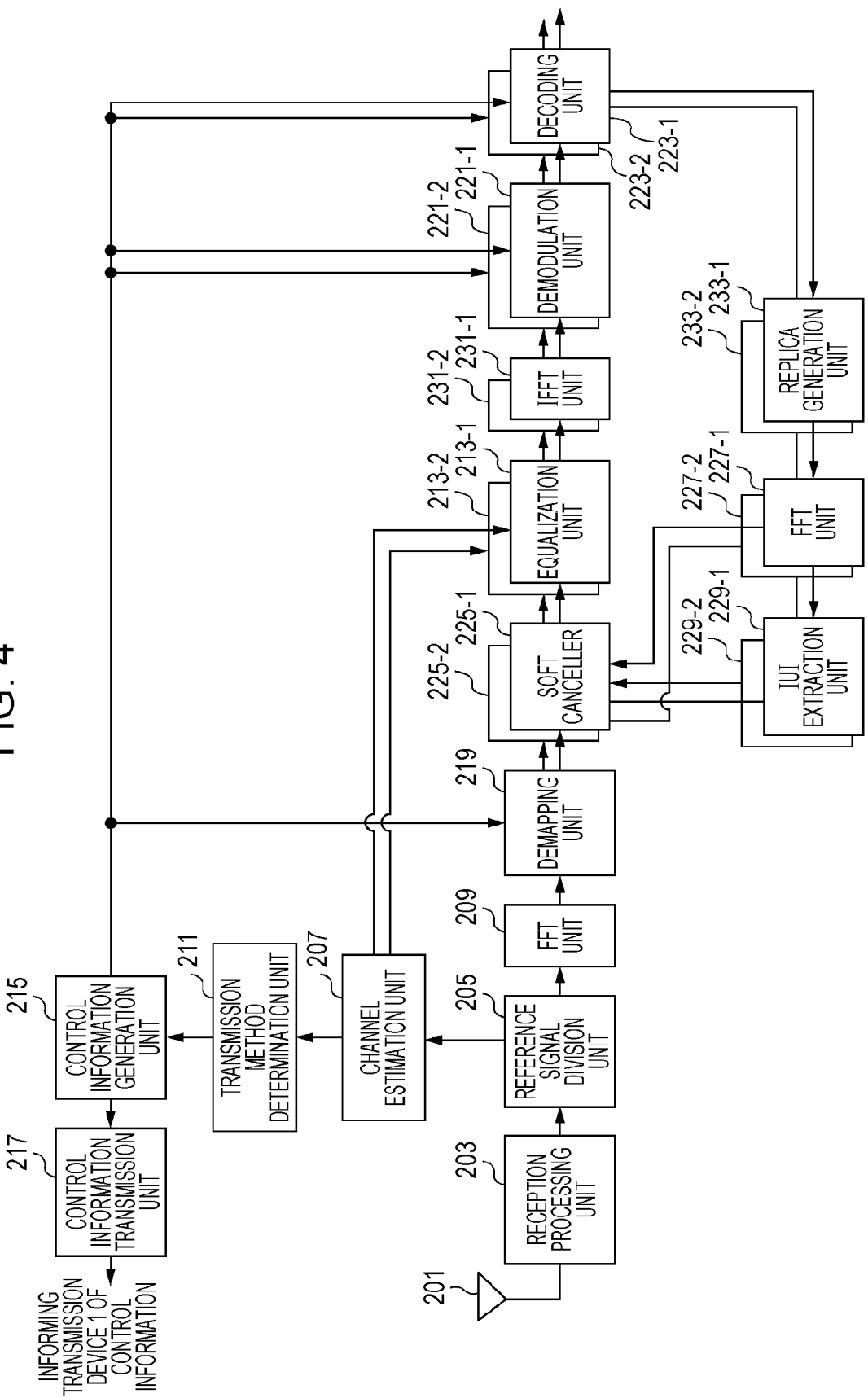
FIG. 4 is a block diagram which illustrates a configuration example of eNB3 as the reception device 3 including one reception antenna 201 according to the present invention.

FIG. 4 is a block diagram which illustrates a configuration example of the eNB3 as the reception device 3 including one reception antenna 201 according to the present invention. However, the eNB may have the plurality of reception antennas 201. In addition, a case in which the number of transmission devices 1 which performs a data transmission at the same time is two will be described, however, the number of transmission devices may be three or more. In the reception device 3, signals from the plurality of transmission devices 1 are received in the reception antenna 201, are performed with downconversion to a base band frequency in a reception processing unit 203, are converted into digital signals through a A/D conversion, and CP is eliminated from the digital signals. The signals which are output from the reception processing unit 203 are divided into a reference signal and a data signal in a reference signal division unit 205, and in which the reference signal is output to the channel estimation unit 207, and the data signal is output to the FFT unit 209. The channel estimation unit 207 estimates a frequency response of a channel in each transmission device 1 from a known reference signal in a transceiving device. All of the estimated channel properties of the transmission device 1 are output to a transmission method determination unit 211, the channel property of the UE1-1 is output to the equalization unit 213-1, and the channel property of the UE1-2 is output to the equalization unit 213-2.

The transmission method determination unit 211 determines a band allocation scheme, a band allocation, a coding method, an MCS or the like in each transmission device 1 based on the channel property, and inputs control information in each transmission device 1 to a control information generation unit 215, respectively. Here, the control information which is determined in the transmission method determination unit 211 will be described later. Processing after the control information generation unit 215 is performed in each transmission device 1, however, a process of transmitting control information to one transmission device 1 will be described. The control information generation unit 215 generates control information with a format which is predetermined among transmission device and reception device using a transmission parameter which is input by the transmission method determination unit 211. The generated control information is converted into a signal to be transmitted to the transmission device 1 in a control information transmitting unit 217, and is notified to the transmission device 1 through a modulation unit, a wireless unit, and a transmission antenna. In addition, the control information generation unit 215 inputs allocation information of a frequency band to a demapping unit 219, and inputs pieces of information on modulation order, a coding rate, and a coding method to demodulation units 221-1 and 221-2, and decoding units 223-1 and 223-2, respectively. Here, since these parameters are used when receiving a signal which is generated by the transmission device 1 based on the control information, the parameters are stored until the signal is received.

On the other hand, the data signal which is divided by the reference signal division unit 205 is converted into a signal in the frequency region from a signal in the time region in the FFT unit 209, and is output to the mapping unit 219 thereafter. The mapping unit 219 extracts a reception signal in the frequency region based on the band allocation information in each transmission device 1, and outputs signals which are transmitted from the UE1-1 and UE1-2 as the transmission device 1 to soft cancellers 225-1 and 225-2, respectively. Hereinafter, the same processing is performed in each signal of the transmission device 1, however, only reception processing of the UE1-1 will be described.

The signal which is extracted from the mapping unit 219 is input to the soft canceller 225-1. In addition, a replica in the frequency region which is generated from decoding bits obtained from the decoding unit 223-1 is input to the soft canceller 225-1 from the FFT unit 227-1. In addition, a replica of inter-user interference which is generated due to overlapping of a part of spectrum between a plurality of transmission devices 1 is input to the soft canceller 225-1 from the IUI extraction unit 229-2. In a case in which the number of transmission devices 1 is three or more, replicas of all of the transmission devices 1 in which the spectrum is overlapped are input to the IUI extraction units 229-1 and 229-2, and a replica of the inter-user interference is generated. The soft canceller 225-1 cancels these replicas from the extracted signal. However, since there is no information obtained from the decoding units 223-1 and 223-2 in the first cancelling processing, there is no work to do. In the equalization unit 213-1, equalization processing for compensating a distortion of a wireless channel is performed using a channel property which is input from the channel estimation unit 207, and outputs the signal to the IFFT unit 231-1. Here, the equalization processing is to multiply a weight based on Minimum Mean Square Error (MMSE) algorithm, a Zero Forcing (ZF) weight, or the like.

The signal which is input from the equalization unit 213-1 is converted into a signal in the time region from a signal in the frequency region by the IFFT unit 231-1. The demodulation unit 221-1 stores information on the modulation order which is determined based on a channel property in the control information generation unit 215, and is transmitted through the control information transmission unit 217. The signal in the time region is performed with a symbol demodulation based on the information on the modulation order which is stored in the demodulation unit 221-1. The decoding unit 223-1 stores information on a coding method, and a coding rate. The demodulated bits are performed with decoding of error correcting by the decoding unit 223-1 based on the stored information on the coding method and coding rate, and as a result, data bits are obtained as output of the decoding unit 223-1. Here, in case of using a turbo code or a convolutional code, the decoding of error correcting is performed using Max-Log-MAP (maximum a posteriori) algorithm, or the like, and in case of using an LDPC code, the decoding of error correcting is performed using Sum-Product algorithm, or the like.

In case of performing turbo equalization processing, a decoding result is output to a replica generation unit 233-1. The replica generation unit 233-1 generates a replica of a transmission modulation symbol by performing a demodulation again with respect to the decoding bits. In the FFT unit 227-1, though it is not shown in this figure, a frequency response of a channel of the UE1-1 which is estimated in the channel estimation unit 207 is input, the generated replica in the time region is converted into a replica in the frequency region, and then, a result in which the replica in the frequency region and the frequency response in the channel are multiplied is input to the soft canceller 225-1. In addition, a signal in which the replica in the frequency region which is obtained in the FFT unit 227-1 and the frequency response of the channel are multiplied is also input to the IUI extraction unit 229-1, only a replica in a band in which the UE1-1 and UE1-2 are overlappingly allocated is extracted, and is input to the soft canceller 225-2. It is used when removing inter-user interference in the soft canceller 225-2 in the reception processing of the UE1-2. By iterating the above processes, reception processing of data which is received by the transmission device 1 is performed.

Figure 5:
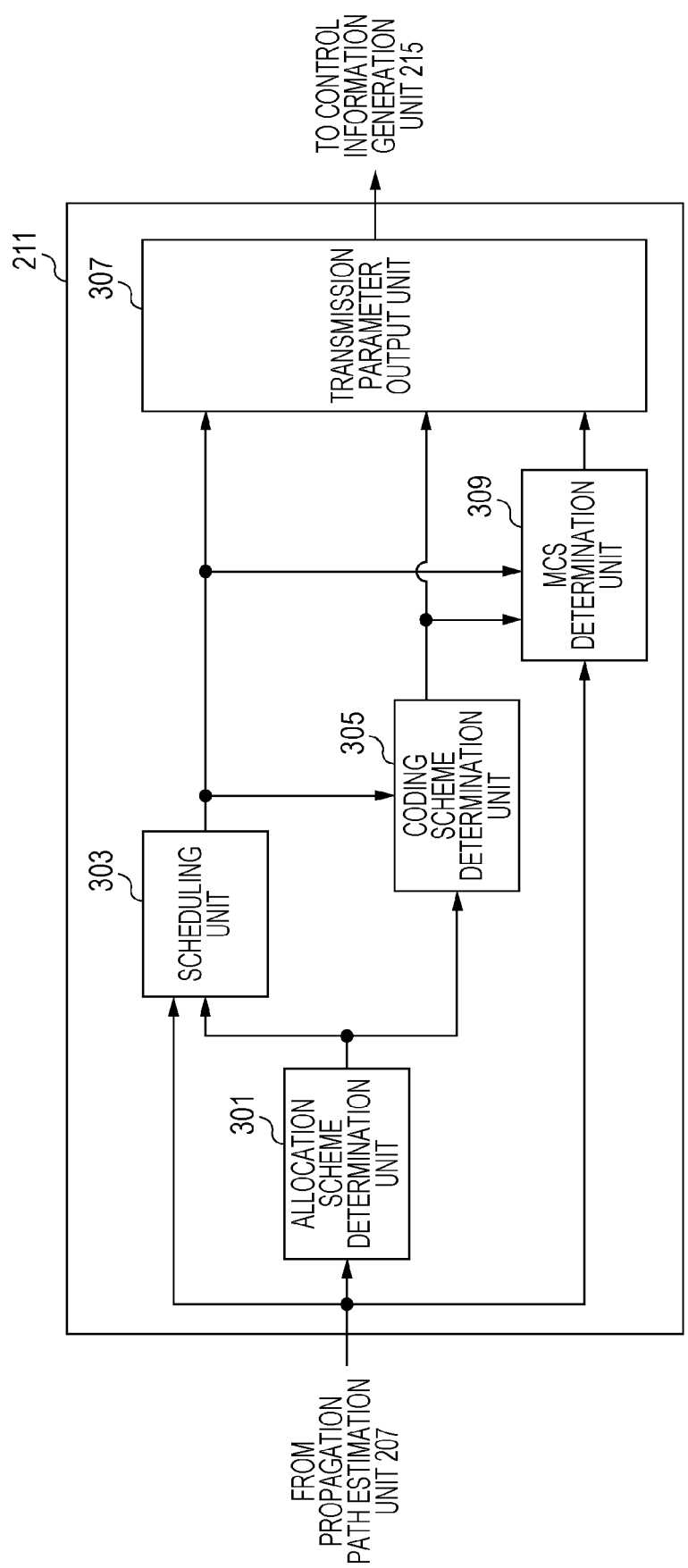
FIG. 5 is a block diagram which illustrates an example of a configuration of a transmission method determination unit 211 according to a first embodiment of the present invention.

FIG. 5 is a block diagram which illustrates a configuration example of the transmission method determination unit 211 according to the first embodiment of the present invention. In the transmission method determination unit 211, all of the input channel properties of the transmission device 1 are input to an allocation scheme determination unit 301, and it is determined whether to perform the allocation using the frequency division multiplexing, or to perform the allocation allowing the overlapping of a part of spectrum between the plurality of transmission devices 1 with respect to the plurality of transmission devices 1. A standard of determining the allocation depends on whether or not the transmission device 1 is allocated with an inferior channel property in case of determining a band allocation using the frequency division multiplexing. For example, a reception Signal to Interference plus Noise power Ratio (SINR) in each transmission device 1 is calculated from a band allocation and a channel estimation value in case of applying the frequency division multiplexing, and is compared to a threshold value of the predetermined reception SINR, or the like. In a scheduling unit 303, a band allocation in each transmission device 1 is determined based on all of the channel properties of the transmission device 1, and the allocation scheme which is determined in the allocation scheme determination unit 301. The band allocation in each transmission device 1 is output to a coding scheme determination unit 305 and a transmission parameter output unit 307.

The coding scheme determination unit 305 determines the coding method in each transmission device 1 based on the allocation scheme which is determined in the allocation scheme determination unit 301. However, in a case in which the band allocation in each transmission device 1 becomes the allocation in which the spectrum is not overlapped as a result by the scheduling unit 303, it may be assumed that an FDMA is selected in the allocation scheme determination unit 301. In case of using the frequency division multiplexing as an allocation scheme when determining a coding method in the coding scheme determination unit 305, interference which is eliminated using turbo equalization is mainly inter-symbol interference caused by multipath, and a turbo code as robust error correcting coding, or the like is used without considering a convergence property of the turbo equalization.

On the other hand, in case of determining a use of the allocation scheme in which overlapping of a part of spectrum is allowed between the plurality of transmission devices 1, the convolutional code, the LDPC code, or the like, which is able to improve the convergence property of the turbo equalization is selected. However, it is not necessary for all of the transmission devices 1 to use the coding which is able to improve the convergence property of the turbo equalization, and at least one transmission device 1 may use the coding. In addition, a transmission device 1 in which the reception SINR is calculated in each transmission device 1 from the band allocation which is determined by the scheduling unit 303, and of which a threshold value is lower than a predetermined threshold value, a transmission device 1 of which a reception SINR is the lowest, or the like, is selected by a user who uses the coding which is able to improve the convergence property of the turbo equalization. However, it is not limited to a determination of the transmission device 1 in which the coding method is changed based on the reception SINR, and the determination may be random. The coding method which is determined as above is output to an MCS determination unit 309, and a transmission parameter output unit 307.

In the MCS determination unit 309, the channel property in each transmission device 1, and the band allocation and the coding method from the scheduling unit 303 and the coding scheme determination unit 305 are input to each of the transmission devices 1, and an MCS in each transmission device 1 is determined. As an example of a determining method of the MCS, the reception SINR is calculated from the band allocation, a Frame Error Rate (FER) property satisfies 0.1 using the coding method which is determined by the coding scheme determination unit 305, a coding rate with the largest number of bits to be transmitted, and modulation order is set, or the like. The MCS in each transmission device 1 is output to the transmission parameter output unit 307 from the MCS determination unit 309. In this manner, the band allocation, the coding method, and the MCS information are input to the transmission parameter output unit 307, respectively, from the scheduling unit 303, the coding scheme determination unit 305, and the MCS determination unit 309. The transmission parameter output unit 307 outputs these transmission parameters to a control information generation unit 215 in order to inform the transmission device 1 of the parameters as control information.

According to the embodiment, a case in which the number of transmission devices 1 is two has been described, however, the number of transmission devices can be three or more, and it may be a type in which at least one transmission device 1 uses a coding method in which a convergence property of the turbo equalization is taken into consideration.

As described above, in a system in which the allocation of allowing overlapping of a part of spectrum between transmission devices 1 in which inter-user interference occurs is performed, and interference removal using the turbo equalization processing is performed, it is possible to prevent a serious deterioration in the transmission property due to the remaining inter-user interference after the turbo equalization, and to realize the improvement of cell throughput or the frequency use efficiency, when at least one transmission device 1 uses the coding method in which the convergence property of the turbo equalization is taken into consideration.

[Modification Example of First Embodiment]

A modification example of the first embodiment will be described. Configurations of a transmission device 1 and a reception device 3 according to the modification example are the same as those in the first embodiment, and correspond to FIGS. 2A and 2B, and FIG. 4, respectively. However, a configuration of a transmission method determination unit 211 in the reception device 3 is different.

Figure 6:
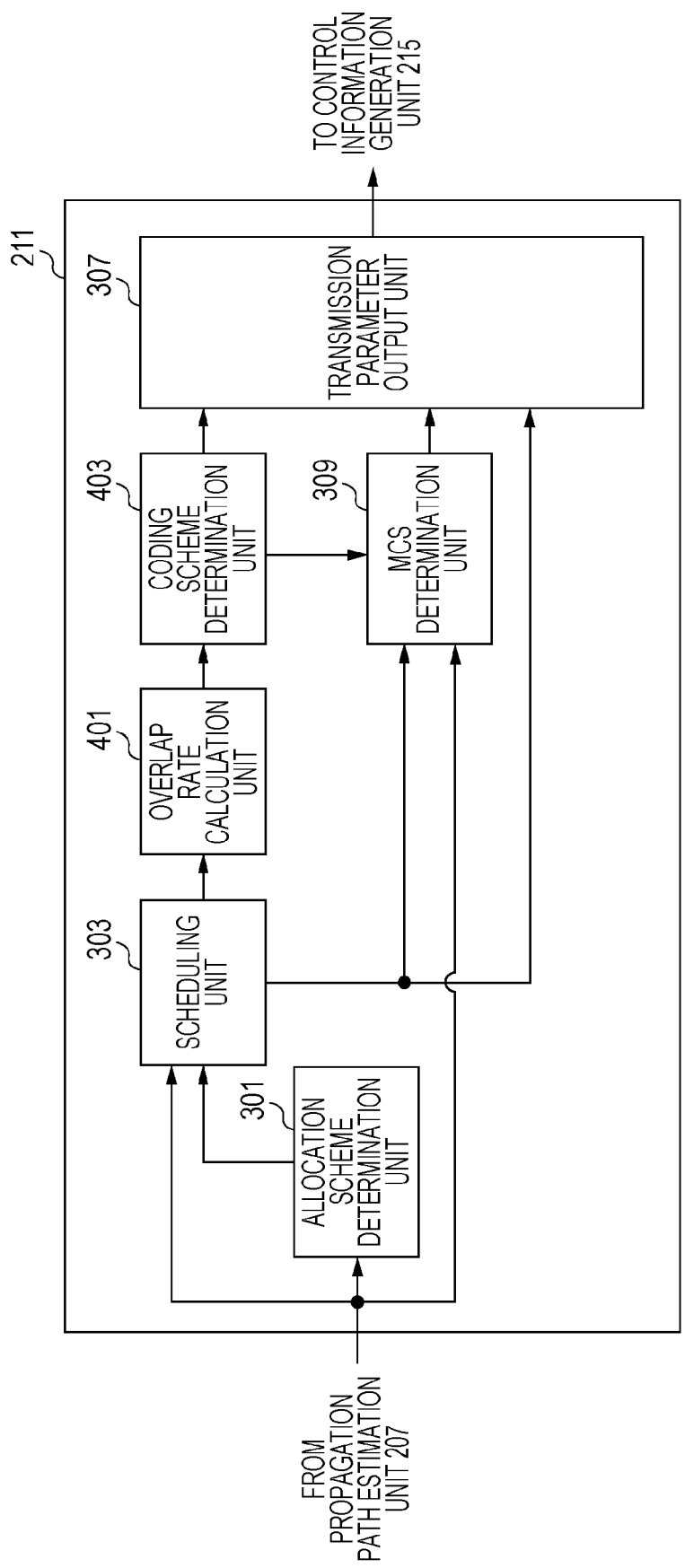
FIG. 6 is a block diagram which illustrates a configuration example of a transmission method determination unit 211 according to a modification example of the first embodiment of the present invention.

FIG. 6 is a block diagram which illustrates a configuration example of the transmission method determination unit 211 according to the modification example of the first embodiment of the present invention. An allocation scheme determination unit 301 and a scheduling unit 303 are the same as those in the first embodiment. However, a band allocation in each transmission device 1 which is determined by the scheduling unit 303 is input to an overlap rate calculation unit 401. In the overlap rate calculation unit 401, a bandwidth $F_{OVERLAP}(i)$ in which an overlapped allocation is performed in a frequency region, and a bandwidth $F_{DIVISION}(i)$ in which non-overlapping allocation is performed are calculated from information of the band allocation which is determined with respect to a plurality of transmission devices 1. However, i is an index denoting the transmission device 1, and when setting the number of transmission devices 1 to $N_{TX}$, $1 \le i \le N_{TX}$ is satisfied.

An overlap rate $R_{OVER}(i)$ in each transmission device 1 is calculated using the following expression.

$$R_{OVER}(i) = F_{OVERLAP}(i)/(F_{OVERLAP}(i) + F_{DIVISION}(i)) \quad \text{Expression (1)}$$

The overlap rate calculation unit 401 outputs the calculated overlap rate $R_{OVER}(i)$ in each transmission device 1 to a coding scheme determination unit 403. In the coding scheme determination unit 403, a threshold value $R_{Max}$ of a predetermined overlap rate is maintained, in a case in which the overlap rate satisfies the Expression (2), a turbo code in which a convergence property of turbo equalization is not taken into consideration is selected, and in a case in which the overlap rate does not satisfy the Expression (3), a convolutional code, or an LDPC code which is able to improve a convergence property of turbo equalization is selected.

$$R_{OVER}(i) < R_{Max} \quad \text{Expression (2)}$$

$$R_{OVER}(i) \ge R_{Max} \quad \text{Expression (3)}$$

The coding method in each transmission device 1 which is determined in the coding scheme determination unit 403 is input to the MCS determination unit 309 and a transmission parameter output unit 307. The MCS determination unit 309 determines an MCS in each transmission device 1 using the same method as that in the first embodiment using a coding method and a band allocation in each transmission device 1, and a channel property in each transmission device 1, and outputs the MCS to the transmission parameter output unit 307 by using. The transmission parameter output unit 307 outputs the band allocation, the coding method, and the MCS of each transmission device 1 to a control information generation unit 215 so as to notify those to the transmission device 1 as control information.

Figure 7:
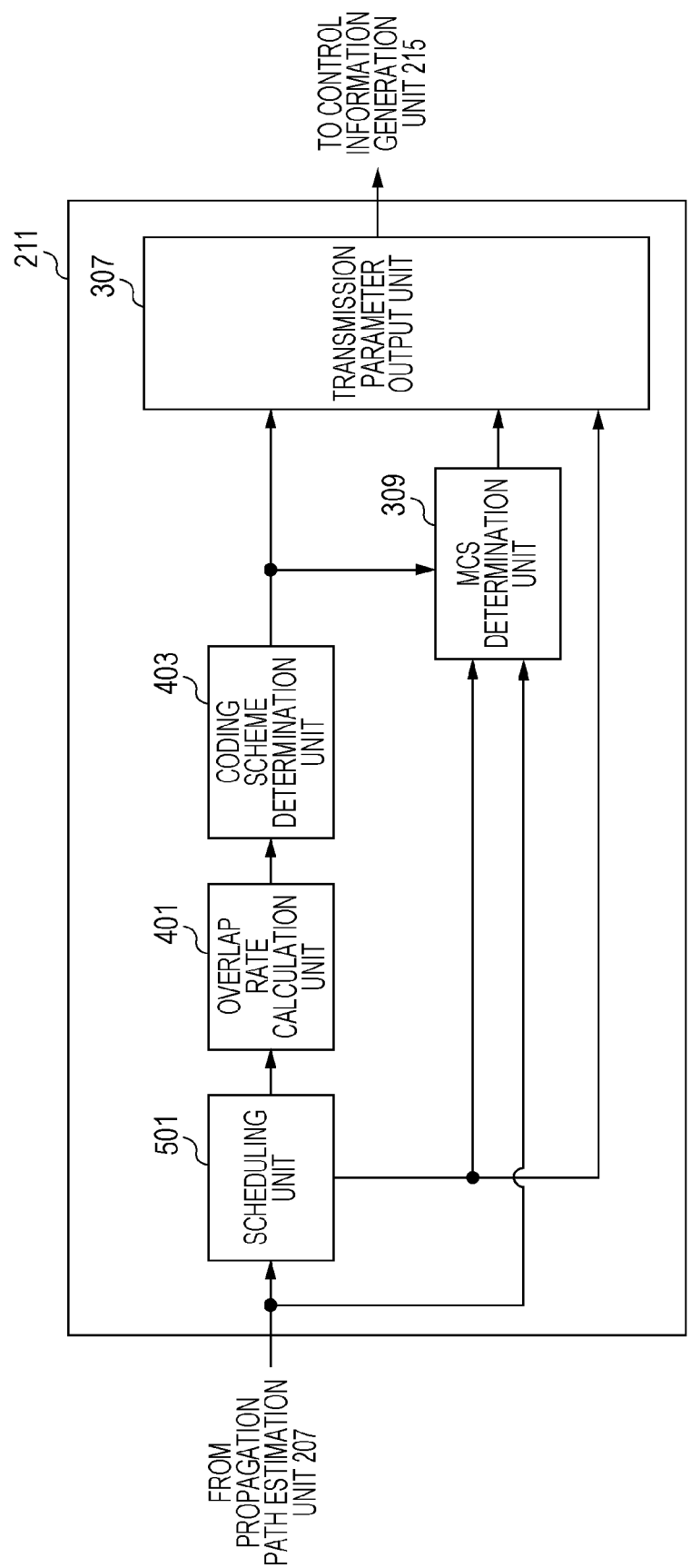
FIG. 7 is a block diagram which illustrates another configuration example of the transmission method determination unit 211 according to the modification example of the first embodiment of the present invention.

FIG. 7 is a block diagram which illustrates another configuration example of the transmission method determination unit 211 according to a modification example in the first embodiment of the present invention. The transmission method determination unit 211 of the reception device 3 may have a configuration in which there is no allocation scheme determination unit 301 as in FIG. 7. In a scheduling unit 501 in the configuration in FIG. 7, a band allocation in each transmission device 1 is determined by allowing overlapping, and an overlap rate is decreased according to a reception SINR. For example, a threshold value $X_{SINR}$ of the reception SINR is predetermined, and an allocation in which the overlap rate is decreased in a range of exceeding the $X_{SINR}$ is set. The scheduling unit 501 outputs the band allocation which is a result of decreasing the overlap rate to an overlap rate calculation unit 401, and may determine a transmission parameter similarly to FIG. 6 thereafter.

Figure 8:
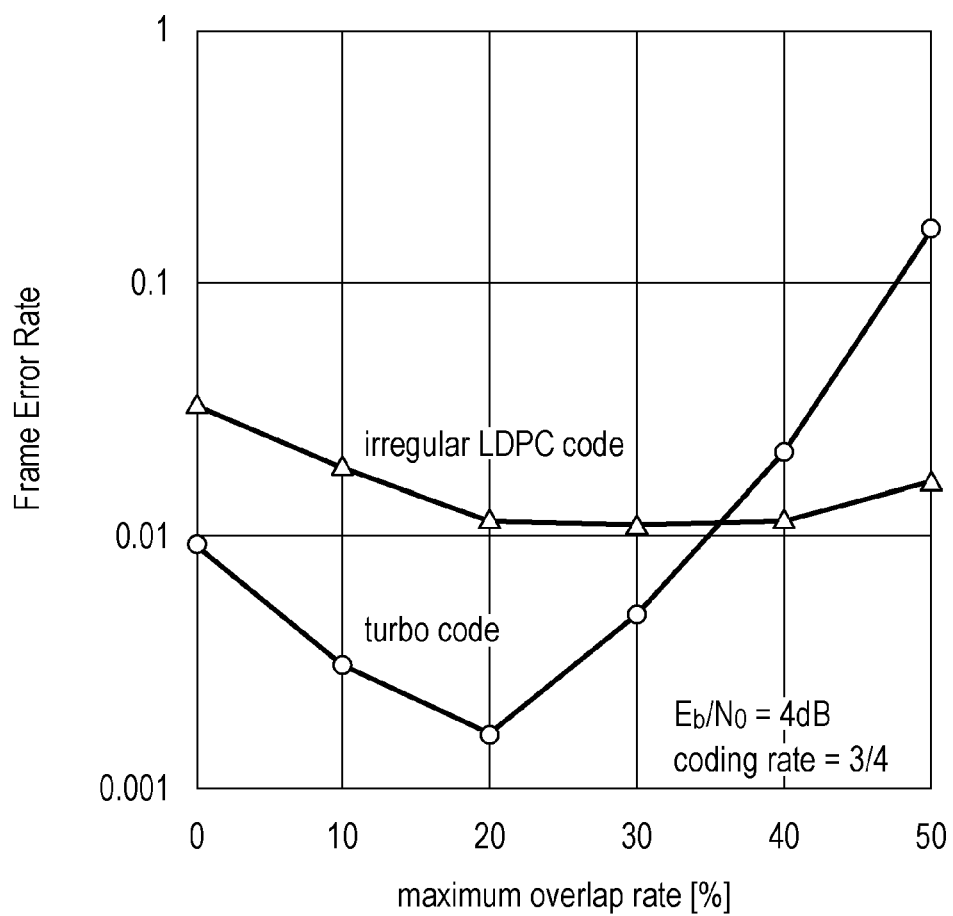
FIG. 8 is a graph which illustrates an FER performance in a case in which all of the transmission devices 1 use the same coding, coding rate, and modulation method by setting the number of transmission devices 1 to two, in the modification example according to the first embodiment of the present invention.

FIG. 8 is a graph which illustrates an FER performance in a case in which the number of transmission devices 1 is set to two, and all of the transmission devices 1 use the same coding, coding rate, and modulation scheme, in the modification example of the first embodiment of the present invention. For the coding, a turbo code in which a convergence property of turbo equalization is not taken into consideration, and an irregular LDPC code in which the convergence property of the turbo equalization is taken into consideration are set, and a coding rate is set to ¾. The modulation scheme is set to QPSK, and the maximum overlap rate is set to 0% (in case of FDM) to 50%. The turbo code is set to a turbo code of which the constraint length is 4, and the LDPC code uses a code which uses check matrix of 4096 rows and 16384 columns, of which weight row is 12, and which is configured by three types of which weight column is denoted in the Table 1.

TABLE 1

| Weight Column | Rate |
|---|---|
| 2 | 98.33% |
| 61 | 0.63% |
| 67 | 1.02% |

In addition, in the number of iterations of turbo equalization, and the number of iterations of decoding, eight times of turbo equalization, and eight times of turbo decoding are set for the turbo code, and iteration of the turbo equalization and Sum-Product of one hundred times are commonly set for the LDPC code. From FIG. 8, it is understood that an FER property of the turbo code seriously deteriorates when the overlap rate exceeds about 35%. For this reason, as an example of $R_{Max}$, 35% is taken into consideration. However, a value of the $R_{Max}$ is not limited to this. According to the modification example, an example in which a coding method of a transmission device 1 with a high overlap rate is set to a coding method in which the convergence property of the turbo equalization is taken into consideration has been described, however, a coding method in which the convergence property of the turbo equalization is taken into consideration may also be applied to a transmission device 1 of which a band is overlappingly allocated to the transmission device 1 with a high overlap rate.

As described above, in a system in which the allocation of allowing overlapping of a part of spectrum between the transmission devices 1 in which the inter-user interference occurs is performed, and interference removal using the turbo equalization processing is performed, it is possible to prevent a serious deterioration in the transmission property due to the remaining inter-user interference after the turbo equalization, and to realize the improvement of cell throughput or the frequency use efficiency, when the overlap rate is taken into consideration, and the transmission device 1 uses the coding method in which the convergence property of the turbo equalization is taken into consideration.

[Second Embodiment]

Configurations of a transmission device 1 and a reception device 3 according to the embodiment are the same as those in the first embodiment, and correspond to FIGS. 2A and 2B, and FIG. 4, respectively. However, a transmission method determination unit 211 of the reception device 3 is different.

Figure 9:
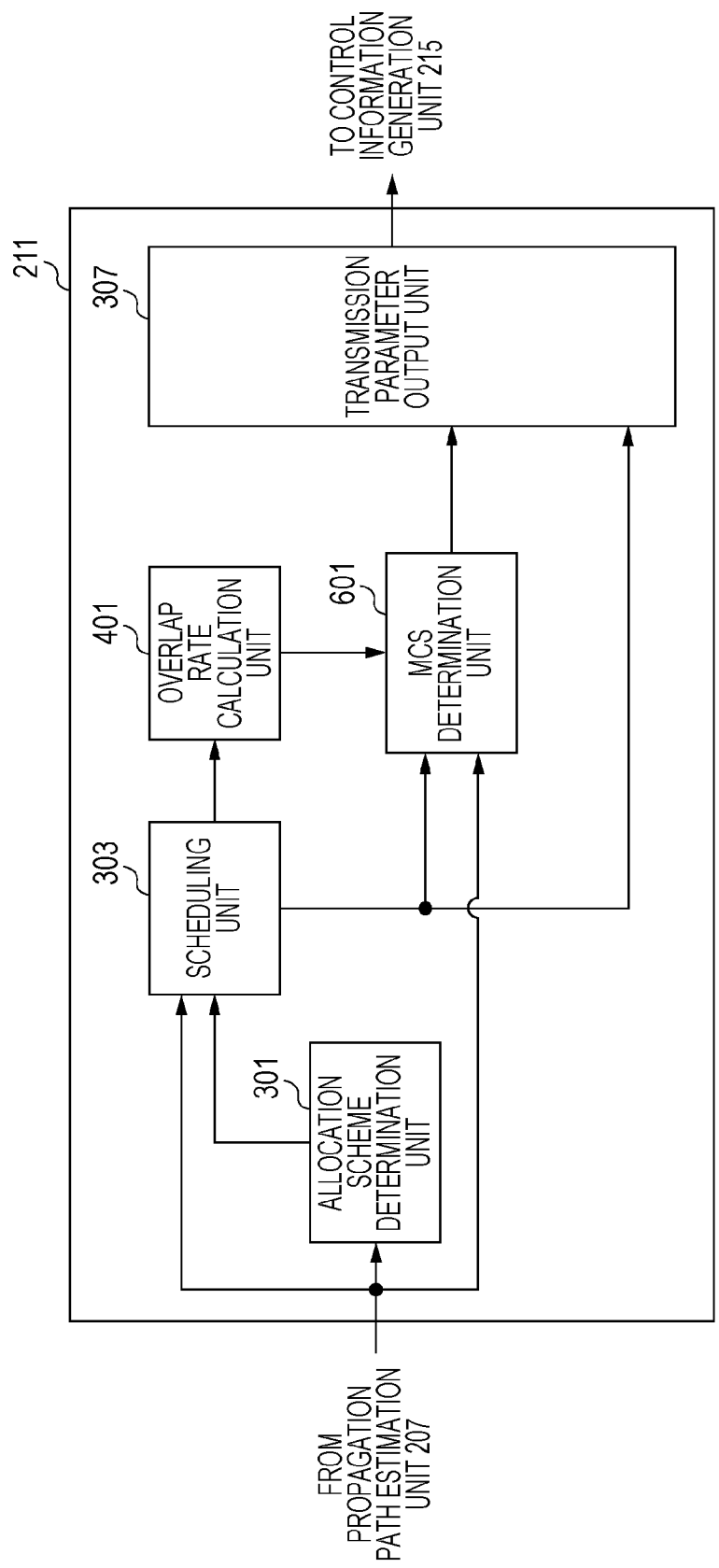
FIG. 9 is a block diagram which illustrates a configuration example of a transmission method determination unit 211 according to a second embodiment of the present invention.

FIG. 9 is a block diagram which illustrates a configuration example of the transmission method determination unit 211 according to the second embodiment of the present invention. Processes in an allocation scheme determination unit 301, a scheduling unit 303, and an overlap rate calculation unit 401 are the same as those in the modification example of the first embodiment. An overlap rate $R_{OVER}$ (i) in each transmission device 1 which is calculated using the overlap rate calculation unit 401 is input to an MCS determination unit 601. In addition, a channel property, and a band allocation in each transmission device 1 are input to the MCS determination unit 601 by a channel estimation unit 207, and a scheduling unit 303, respectively.

Figure 10:
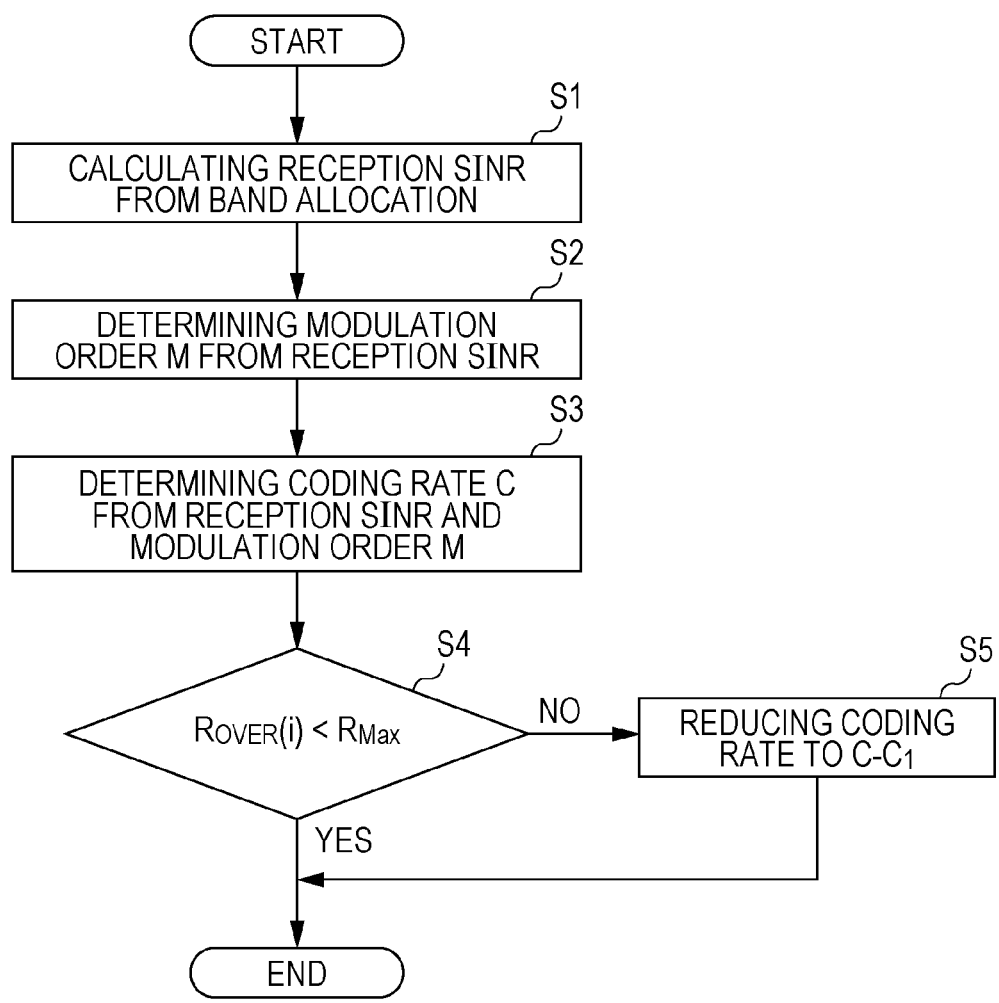
FIG. 10 is a flowchart of determining a coding rate and a modulation method in an MCS determination unit 601 according to the second embodiment of the present invention.

FIG. 10 is a flowchart in which a coding rate and a modulation scheme in the MCS determination unit 601 according to the second embodiment of the present invention are determined. First, the MCS determination unit 601 calculates a reception SINR in each transmission device 1 based on information on a band allocation (step S1). Subsequently, the MCS determination unit 601 determines modulation order M from the reception SINR (step S2). Subsequently, the MCS determination unit 601 determines a coding rate C from the reception SINR and the modulation order M (step S3). Here, the MCS determination unit 601 is assumed to have a corresponding table of the reception SINR, the modulation order M, and the coding rate C which is used when determining the modulation order M, and the coding rate C from the reception SINR. The MCS determination unit 601 determines whether or not the overlap rate $R_{OVER}$ (i) is smaller than a threshold value $R_{Max}$ of the overlap rate which is predetermined (step S4), and when the overlap rate is small (Yes in step S4), an MCS is determined. In a case in which the overlap rate $R_{OVER}$ (i) is equal to or greater than the threshold value $R_{Max}$ (No in step S4), the coding rate C is lowered in consideration of the convergence property of the turbo equalization in S5, and the coding rate which will be notified to the transmission device 1 is set to C-C1 (step S5). For example, when setting C to ¾, the coding rate is lowered to ½ by setting C1 to ¼.

According to the embodiment, the threshold value $R_{Max}$ of the overlap rate has been described as a constant value, however, the value may be a different value by at least one of the modulation order M and the coding rate C. In addition, even in C1, when lowering the coding rate, a range of reducing may be set to be different by the modulation order M, or the coding rate C which is selected in S3, without being constant. In addition, according to the embodiment, it is determined whether or not to lower the coding rate C using the threshold value $R_{Max}$ of the overlap rate, however, when $R_{OVER}$ (i)>0, the coding rate C may be necessarily lowered.

As described above, in the system in which the allocation of allowing overlapping of a part of spectrum between the transmission devices 1 in which the inter-user interference occurs is performed, and interference removal using the turbo equalization processing is performed, it is possible to prevent a serious deterioration in the transmission property due to the remaining inter-user interference after the turbo equalization, and to realize the improvement of cell throughput or the frequency use efficiency, when the overlap rate is taken into consideration, and the transmission device 1 uses the coding rate in which the convergence property of the turbo equalization is taken into consideration.

[Third Embodiment]

Configurations of a transmission device 1 and a reception device 3 according to the embodiment are the same as those in the first embodiment, and correspond to FIGS. 2A and 2B, and FIG. 4, respectively. In addition, a configuration of a transmission method determination unit 211 of the reception device 3 is the same as that in FIG. 9, however, determination methods of a coding rate C and modulation order M in an MCS determination unit 601 are different.

Figure 11:
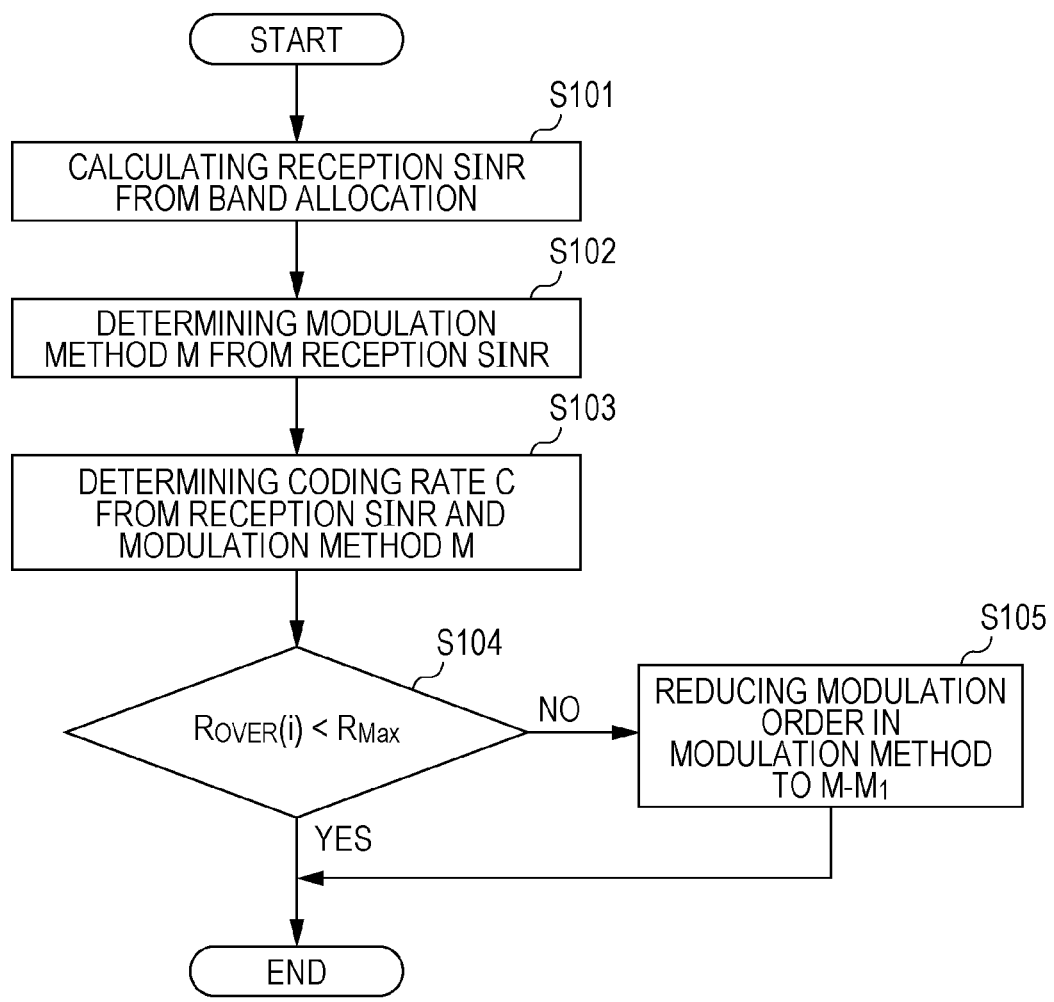
FIG. 11 is a flowchart of determining a coding rate and a modulation method in an MCS determination unit 601 according to a third embodiment of the present invention.

FIG. 11 is a flowchart in which a coding rate and a modulation scheme in the MCS determination unit 601 according to the third embodiment of the present invention are determined. The MCS determination unit 601 calculates a reception SINR in each transmission device 1 (step S101), and determines modulation order M and a coding rate C, respectively (steps S102 and S103). The modulation order M and the modulation scheme are correlated with each other as in the Table 2.

TABLE 2

| M | Modulation Scheme |
|---|---|
| 2 | QPSK |
| 4 | 16 QAM |
| 6 | 64 QAM |

Subsequently, the MCS determination unit 601 determines whether or not the overlap rate $R_{OVER}$ (i) is smaller than a threshold value $R_{Max}$ of the overlap rate which is predetermined (step S104), and when the overlap rate is small (Yes in step S104), an MCS is determined. In a case in which the overlap rate $R_{OVER}$ (i) is equal to or greater than the threshold value $R_{Max}$ (No in step S104), the MCS determination unit 601 lowers the modulation order in consideration of a convergence property of turbo equalization, and sets the modulation order which will be notified to the transmission device 1 to M-M1 (step S105). For example, the modulation order is lowered by setting the modulation scheme to 16QAM when M=4, and setting the modulation scheme to QPSK when M1=2.

According to the embodiment, the threshold value $R_{Max}$ of the overlap rate has been described as a constant value, however, the value may be a different value by at least one of the modulation order M and the coding rate C. In addition, even in M1, when lowering the modulation order, a range of reducing may be set to be different by the modulation order M, or the coding rate C which is selected in S3, without being constant. In addition, according to the embodiment, it is determined whether or not to lower the modulation order using the threshold value $R_{Max}$ of the overlap rate, however, when $R_{OVER}$ (i)>0, the modulation order may be necessarily lowered.

Figure 12:
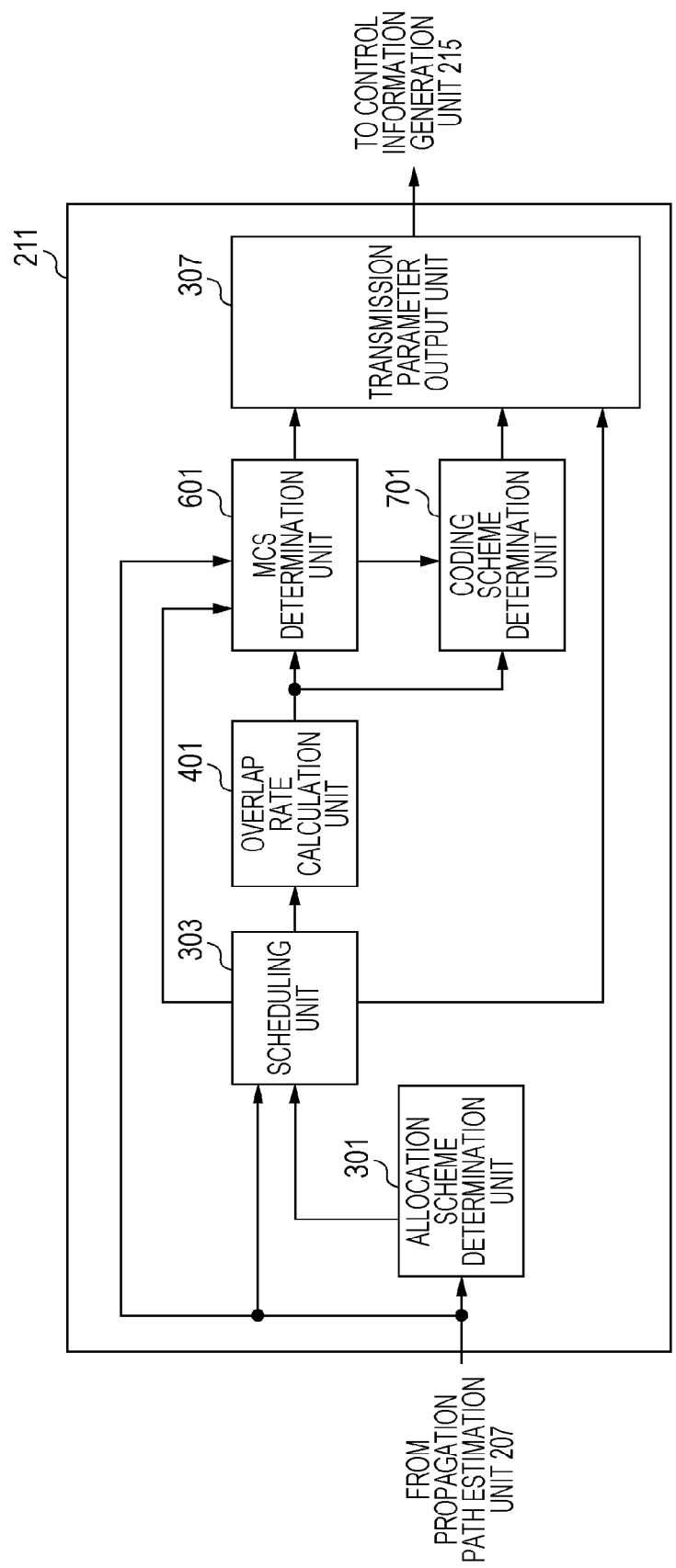
FIG. 12 is a block diagram which illustrates another configuration example of a transmission method determination unit 211 according to the third embodiment of the present invention.

FIG. 12 is a block diagram which illustrates another configuration example of the transmission method determination unit 211 according to the third embodiment of the present invention. The convolutional code which is able to improve the convergence property of turbo equalization, or the LDPC code may be applied using a coding scheme determination unit 701, along with lowering of the modulation order as in FIG. 12, without being limited to the configuration of the transmission method determination unit 211 in FIG. 9. Since a method of selecting coding is the same as that in the first embodiment, descriptions thereof will be omitted.

Figure 13:
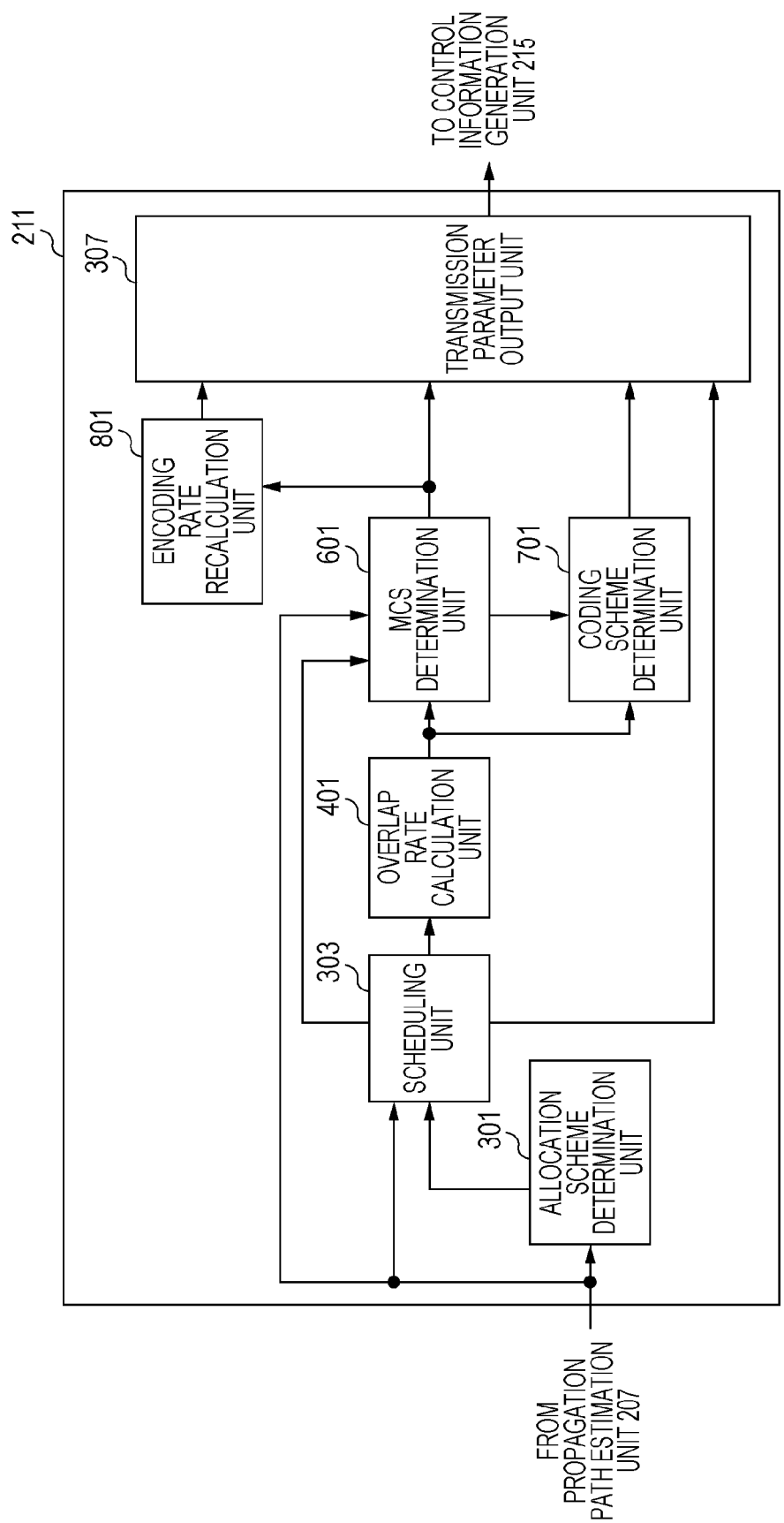
FIG. 13 is a block diagram which illustrates a still another configuration example of the transmission method determination unit 211 according to the third embodiment of the present invention.

FIG. 13 is a block diagram which illustrates further another configuration example of the transmission method determination unit 211 according to the third embodiment of the present invention. FIG. 13 is the same as FIG. 12 up to the coding scheme determination unit 701, and a coding rate recalculation unit 801 is added thereto. Since the number of bits which can be transmitted becomes small when the MCS determination unit 601 lowered the modulation order due to the determination in step S104 in FIG. 11, the number of bits which can be transmitted may be maintained in the coding rate recalculation unit 801 by raising the coding rate.

As described above, in a system in which the allocation of allowing overlapping of a part of spectrum between the transmission devices 1 in which the inter-user interference occurs is performed, and interference removal using the turbo equalization processing is performed, it is possible to prevent a serious deterioration in the transmission property due to the remaining inter-user interference after the turbo equalization, and to realize the improvement of cell throughput or the frequency use efficiency, when the overlap rate is taken into consideration, and the transmission device 1 uses the modulation scheme in which the convergence property of the turbo equalization is taken into consideration.

A program which is operated in the UE1 and the eNB3 according to the invention is a program which controls a CPU or the like (program which causes computer to function) so as to realize functions in the embodiments relating to the present invention. In addition, information which is handled in these device is temporarily accumulated in a RAM at the time of processing, is stored in various ROMs or HDDs thereafter, is read out by the CPU as necessary, and is performed with a correction and writing. As a recording medium in which the program is stored, any one of a semiconductor medium (for example, ROM, non-volatile memory card, or the like), an optical recording medium (for example, DVD, MO, MD, CD, BD, or the like), a magnetic recording medium (for example, magnetic tape, flexible disk, or the like), and the like may be used.

In addition, there is also a case in which functions in the present invention are executed by being processed in cooperation with an operating system, another application program, or the like, based on an instruction from the program, not only executing the functions of the above described embodiments by executing a loaded program. In addition, in case of distributing the program in the market, it is possible to store the program in a portable recording medium, and distribute the program, or transmit to a connected server computer through a network such as the Internet. In this case, a storage unit of the server computer is also included in the present invention.

In addition, a part or all of the UE1 and the eNB3 according to the embodiment may be realized as an LSI which is an integrated circuit, typically. Each function block of the UE1 and the eNB3 may be made a chip individually, or may be made a chip by integrating a part or all thereof. In addition, a method of making the integrated circuit is not limited to the LSI, and may be realized using a dedicated circuit, or a general processor. In addition, in a case in which a technology of making the integrated circuit which is substituted by the LSI appears due to a progress in a semiconductor technology, it is also possible to use an integrated circuit using the technology.

As described above, the embodiments of the invention has been described in detail with reference to drawings, however, a specific configuration is not limited to the embodiments, and a design or the like which does not depart from the scope of the invention is also included in claims.

REFERENCE SIGNS LIST 1, 1-1, 1-2 UE TRANSMISSION DEVICE
3 eNB RECEPTION DEVICE
101-1, 101-2 CONTROL INFORMATION RECEPTION UNIT
103-1, 103-2 CODING UNIT
105-1, 105-2 MODULATION UNIT
107-1, 107-2 MAPPING UNIT
109-1, 109-2 REFERENCE SIGNAL GENERATION UNIT
111-1, 111-2 FFT UNIT
113-1, 113-2 IFFT UNIT
115-1, 115-2 REFERENCE SIGNAL MULTIPLEXING UNIT
117-1, 117-2 TRANSMISSION PROCESSING UNIT
119-1, 119-2 TRANSMISSION ANTENNA
201 ANTENNA
203 RECEPTION PROCESSING UNIT
205 REFERENCE SIGNAL DIVISION UNIT
207 CHANNEL ESTIMATION UNIT
209 FFT UNIT
211 TRANSMISSION METHOD DETERMINATION UNIT
213-1, 213-2 EQUALIZATION UNIT
215 CONTROL INFORMATION GENERATION UNIT
217 CONTROL INFORMATION TRANSMISSION UNIT
219 DEMAPPING UNIT
221-1, 221-2 DEMODULATION UNIT
223-1, 223-2 DECODING UNIT
225-1, 225-2 SOFT CANCELLER
227-1, 227-2 FFT UNIT
229-1, 229-2 IUI EXTRACTION UNIT
231-1, 231-2 IFFT UNIT
233-1, 233-2 REPLICA GENERATION UNIT
301 ALLOCATION SCHEME DETERMINATION UNIT
303 SCHEDULING UNIT
305 CODING SCHEME DETERMINATION UNIT
307 TRANSMISSION PARAMETER OUTPUT UNIT
309 MCS DETERMINATION UNIT
401 OVERLAP RATE CALCULATION UNIT
403 CODING SCHEME DETERMINATION UNIT
501 SCHEDULING UNIT
601 MCS DETERMINATION UNIT
701 CODING SCHEME DETERMINATION UNIT
801 CODING RATE RECALCULATION UNIT

The invention claimed is:

1. A wireless control device receiving a signal which is transmitted by a plurality of wireless terminal devices at the same transmitting timing, and performs a signal detection using turbo equalization, the device comprising:

a transmission method determination unit which selects a communication parameter of which a convergence property of turbo equalization is higher than that of a communication parameter which is used in a transmission method in which a spectrum is not overlapped with respect to at least one wireless terminal device, in case of performing data transmission using a transmission method in which at least a part of the spectrum is overlapped between the wireless terminal devices; and a control information transmission unit which informs the wireless terminal device of the selected communication parameter.

2. The wireless control device according to claim 1, wherein the transmission method determination unit selects a communication parameter of which a convergence property of turbo equalization is higher than that of the communication parameter which is used in the transmission method in which a spectrum is not overlapped between the wireless terminal devices, based on a ratio of a spectrum which is overlapped between the wireless terminal devices to a spectrum which is not overlapped therebetween.

3. The wireless control device according to claim 1, wherein the transmission method determination unit uses a turbo code as a communication parameter in the transmission method in which a spectrum is not overlapped between the wireless terminal devices, and on the other hand, the transmission method determination unit uses a convolutional code, or a Low Density Parity Check (LDPC) code as a communication parameter with respect to at least one wireless terminal device in the transmission method in which at least a part of spectrum is overlapped between the wireless terminal devices.

4. The wireless control device according to claim 1, wherein the transmission method determination unit uses either a high coding rate or high order modulation as the communication parameter in the transmission method in which a spectrum is not overlapped between the wireless terminal devices, and on the other hand, the transmission method determination unit uses a coding rate which is lower than the coding rate, or modulation order which is lower than the modulation order as the communication parameter in the transmission method in which at least a part of spectrum is overlapped between the wireless terminal devices.

5. The wireless control device according to claim 1, wherein the transmission method determination unit uses the high order modulation as the communication parameter in the transmission method in which a spectrum is not overlapped between the wireless terminal devices, and on the other hand, the transmission method determination unit uses modulation order which is lower than the modulation order, and the convolutional code, or the Low Density Parity Check (LDPC) code as the communication parameter in the transmission method in which at least a part of the spectrum is overlapped between the wireless terminal devices.

6. The wireless control device according to claim 5, wherein the transmission method determination unit increases the coding rate so as to maintain the number of bits which can be transmitted in case of using the low order modulation.

7. The wireless control device according to claim 1, wherein the transmission method determination unit selects either the transmission method in which at least a part of spectrum is overlapped between the wireless terminal devices or the transmission method in which the spectrum is not overlapped between the wireless terminal devices according to a channel property in each of the wireless terminal devices.

8. A wireless terminal device which performs data transmission with respect to a wireless control device using a communication parameter which is informed from the wireless control device according to claim 1.

9. A non-transitory computer readable medium having stored thereon a control program which performs signal detection using turbo equalization by receiving a signal which is transmitted at the same transmission timing by a plurality of wireless terminal devices, and the program, when executed by processor, causing the processor to perform the steps of:
   selecting either a transmission method in which at least a part of spectrum is overlapped between the wireless terminal device, or a transmission method in which the spectrum is not overlapped between the wireless terminal devices according to a channel property in each of the wireless terminal devices;
   selecting a communication parameter of which a convergence property of turbo equalization is higher than that in a communication parameter which is used in the transmission method in which the spectrum is not overlapped, with respect to at least one wireless terminal device, in case of performing data transmission using the transmission method in which at least a part of spectrum is overlapped between the wireless terminal devices; and
   informing the wireless terminal device of the selected communication parameter.

10. An integrated circuit which causes a wireless control device to perform a plurality of functions, the functions include a series of functions of,
   performing a signal detection using turbo equalization by receiving a signal which is transmitted at the same transmission timing by a plurality of wireless terminal devices;
   selecting either a transmission method in which at least a part of spectrum is overlapped between the wireless terminal devices or a transmission method in which the spectrum is not overlapped between the wireless terminal devices according to a channel property in each of the wireless terminal devices;
   selecting a communication parameter of which a convergence property of turbo equalization is higher than that in a communication parameter which is used in the transmission method in which the spectrum is not overlapped, with respect to at least one wireless terminal device, in case of performing a data transmission using the transmission method in which at least a part of spectrum is overlapped between the wireless terminal devices; and
   informing the wireless terminal device of the selected communication parameter.

* * * * *